(12) United States Patent
Garg

(10) Patent No.: US 6,556,468 B2
(45) Date of Patent: Apr. 29, 2003

(54) HIGH BIT DENSITY, HIGH SPEED, VIA AND METAL PROGRAMMABLE READ ONLY MEMORY CORE CELL ARCHITECTURE

(75) Inventor: Anurag Garg, Uttar Pradesh (IN)

(73) Assignee: STMicroelectronics Ltd., Uttar Pradesh (IN)

( * ) Notice: Subject to any disclaimer, the term of this patent is extended or adjusted under 35 U.S.C. 154(b) by 0 days.

(21) Appl. No.: 09/917,226

(22) Filed: Jul. 27, 2001

(65) Prior Publication Data

US 2002/0091894 A1 Jul. 11, 2002

(30) Foreign Application Priority Data

Jul. 31, 2000 (IN) .................................................. 706/00

(51) Int. Cl.[7] .............................................. G11C 17/00
(52) U.S. Cl. ......................................... 365/104; 365/45
(58) Field of Search ............................... 365/185.03, 45, 365/104

(56) References Cited

U.S. PATENT DOCUMENTS

| 5,018,103 | A | * | 5/1991 | Pomper et al. ............. 365/104 |
| 5,640,350 | A | * | 6/1997 | Iga .............................. 365/186 |
| 5,917,224 | A | | 6/1999 | Zangara ...................... 257/390 |
| 5,939,740 | A | * | 8/1999 | Hashimoto et al. ......... 257/202 |

* cited by examiner

*Primary Examiner*—Huan Hoang
(74) *Attorney, Agent, or Firm*—Allen, Dyer, Doppelt Milbrath & Gilchrist, P.A.; Lisa K. Jorgenson

(57) ABSTRACT

A high bit density, high speed, via and metal BE type programmable ROM core cell architecture for storing large amounts of non-volatile data and having a relatively fast turn around time is provided. The ROM core cell may include memory cells organized in rows and columns where each of the memory cells includes three transistors and two bit lines. The arrangement between the three transistors and two bit lines may be such that each of the memory cells is capable of storing four bits of data.

42 Claims, 4 Drawing Sheets

Node 1 may be connected to BL1 or to GND.

Node 2 may be connected to BL2 or to GND.

Node 3 may be connected to BL1 or to GND.

Node 4 may be connected to BL2 or to GND.

HIGH BIT DENSITY, HIGH SPEED, VIA AND METAL PROGRAMMABLE READ ONLY MEMORY CORE CELL ARCHITECTURE

FIELD OF THE INVENTION

The present invention relates to the field of electronic circuits, and, more particularly, to memory devices. More specifically, the invention relates to a high bit density, high speed, via and metal BE type programmable read only memory (ROM) core cell architecture for storing of large amounts of non-volatile data which provides a relatively fast turn around time.

BACKGROUND OF THE INVENTION

The complexity of integrated circuits is continually increasing. As a result, there is need for high bit density ROMs that can store large amounts of non-volatile data and that allow quick access thereto. In today's competitive market, the time to market an electronic device needs to be as short as possible. Thus, when ROMs are used in such electronic devices, the ROMs should provide for a short turn around time. The turn around time primarily depends upon the fabrication stage at which programming of non-volatile data is done. If the programming is done at a later stage of fabrication, turn around time will be less.

Depending upon the level of programmability, ROMs are classified into two categories, namely, FE (lower levels, like active/poly/oxides/doping) and BE (metal/via/contact) programmable. FE programmable ROMS have high bit density, but they also have a longer turn around time. On the other hand, BE programmable ROMs have a fast turn around time, but they have reduced bit density. Thus, there is a need for a high density ROM that has fast turn around time.

Conventional ROM memory cells may include a transistor for storing each bit of information. The memory cells are organized on a row-and-column basis. The core matrix of a via programmable ROM cell is shown in FIG. 1. It has a bit line BL running "vertically" and a word line WL running "horizontally." A MOS transistor T00 stores one bit of data, i.e. a 0 or 1. The source of the transistor T00 is connected to GND (e.g., a ground supply line), and its gate is connected to the word line WL. Node 1, which is connected to the drain of the transistor T00, allows for programing by a via connected to the bit line BL.

The drain is programmed through the bit line BL and via to store one bit of data. Initially, the bit line BL is precharged to a voltage on a power supply line (e.g., VDD). When the memory cell is accessed by enabling one particular word line WL, if the via is present to connect the drain of memory cell transistor to the bit line, the bit line will discharge through the transistor to ground. One of these two conditions is understood as 0 and the other as 1.

The layout of a conventional BE programmable ROM in 0.18 micron technology is shown in FIG. 2. The bit line is a metallization layer (metal3), and the ground GND is formed by diffusion. Programming is performed using via2. From FIG. 2 it is clear that since contacts can not be shared between vertically adjacent memory cells, more surface area is required. Though a conventional BE programmable ROM has the advantage of fast time to market, it may suffer from the following disadvantages: the area of a BE programmable ROM memory cell is 30%–40% more than that of an FE programmable ROM memory cell; the transistor size is fixed and determined by contact size and related design rules; the GND is formed by diffusion, which increases the resistance of an access transistor and hence reduces the speed; and reliability is reduced since the drains of the unprogrammed cells are at a high impedance.

SUMMARY OF THE INVENTION

Based on the foregoing background, it is an object of the present invention to provide a high bit density in a BE programmable ROM core cell architecture.

Another object of the invention is to provide a memory cell transistor size that is larger than a contact size to provide increased speed.

Yet another object of the present invention is to provide a method of programming in which no node in the memory cell is in a high impedance state.

These and other objects, features, and advantages in accordance with the present invention are provided by a high bit density, high speed, via and metal BE type programmable ROM core cell architecture for storing large amounts of non-volatile data and having a relatively fast turn around time. The ROM core cell may include memory cells organized on a row and column basis where each of the memory cells includes three transistors and two bit lines. The arrangement between the three transistors and the two bit lines may be such that each of the memory cells is capable of storing four bits of data.

More particularly, the transistors may be MOS transistors. Any two of the three transistors may be capable of storing one bit of data in their respective drains and another bit of data in their respective sources independent of each other. During reading of the ROM, the capacitance of only selected bit lines is charged and all other bit lines are held at ground, which results in reduced power consumption and reduced leakage current.

The ground layer of the ROM may be routed in metal instead of being a diffusion layer, which provides less ground resistance. Moreover, the memory cell need not have any high impedance node, which provides improved reliability. Programming of the ROM may be performed using BE layers to achieve faster turn around timing. More particularly, programming of the transistors may be performed using 16 possible combinations, namely, "0000", "0001", "0010, "0011", "0100", 0101", 0110, "0111", "1000", 1001, "1010", "1011", "1100", "1101, "1110", "1111".

Each memory cell may have two metal bit lines. The drain and source of each transistor in the memory cell may be connected to one metallization level in the memory cell. Thus, programming of the drain and source of the transistor may be performed by the bit line in same level metal, since the drain and source have a direct metal connection therewith, and also by connection to another bit line in a higher metallization level using a via.

The selected bit line is preferably of a memory cell that is going to be selected by the word line in the same cycle. This is achieved by proper designing of the row and column decoder of the ROM memory core. A logic 0 can be stored by connecting the drain of the transistor to one bit line and the source of the transistor to GND. A logic 0 may also be stored by connecting the drain of the transistor to one bit line and the source of the transistor to another bit line. Further, a logic 1 can be stored by connecting the drain and source of the transistor to the same bit line, or by connecting the drain and source of the transistor to GND.

BRIEF DESCRIPTION OF THE DRAWINGS

The invention will now be described with reference to the accompanying drawings, in which.

DETAILED DESCRIPTION OF THE PREFERRED EMBODIMENTS

Figure 1:
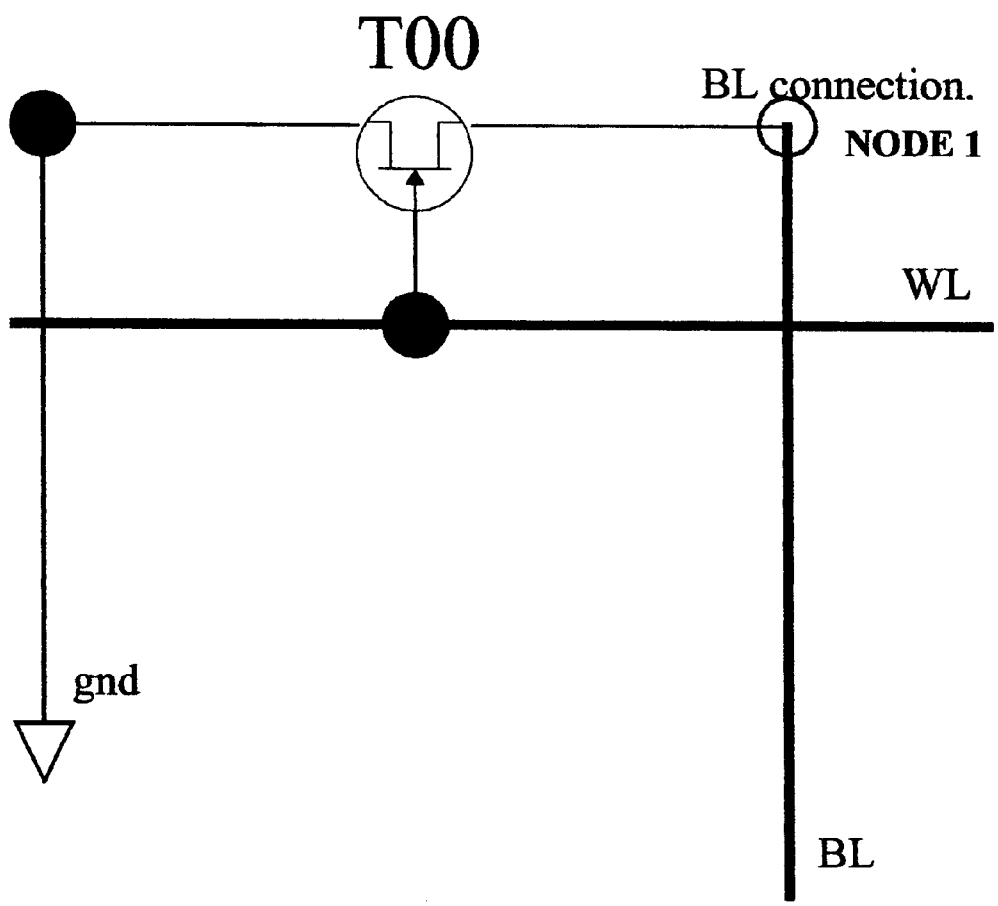
FIG. 1 is a schematic diagram of a conventional ROM core architecture according to the prior art with BE programming in the memory cells.
Figure 2:
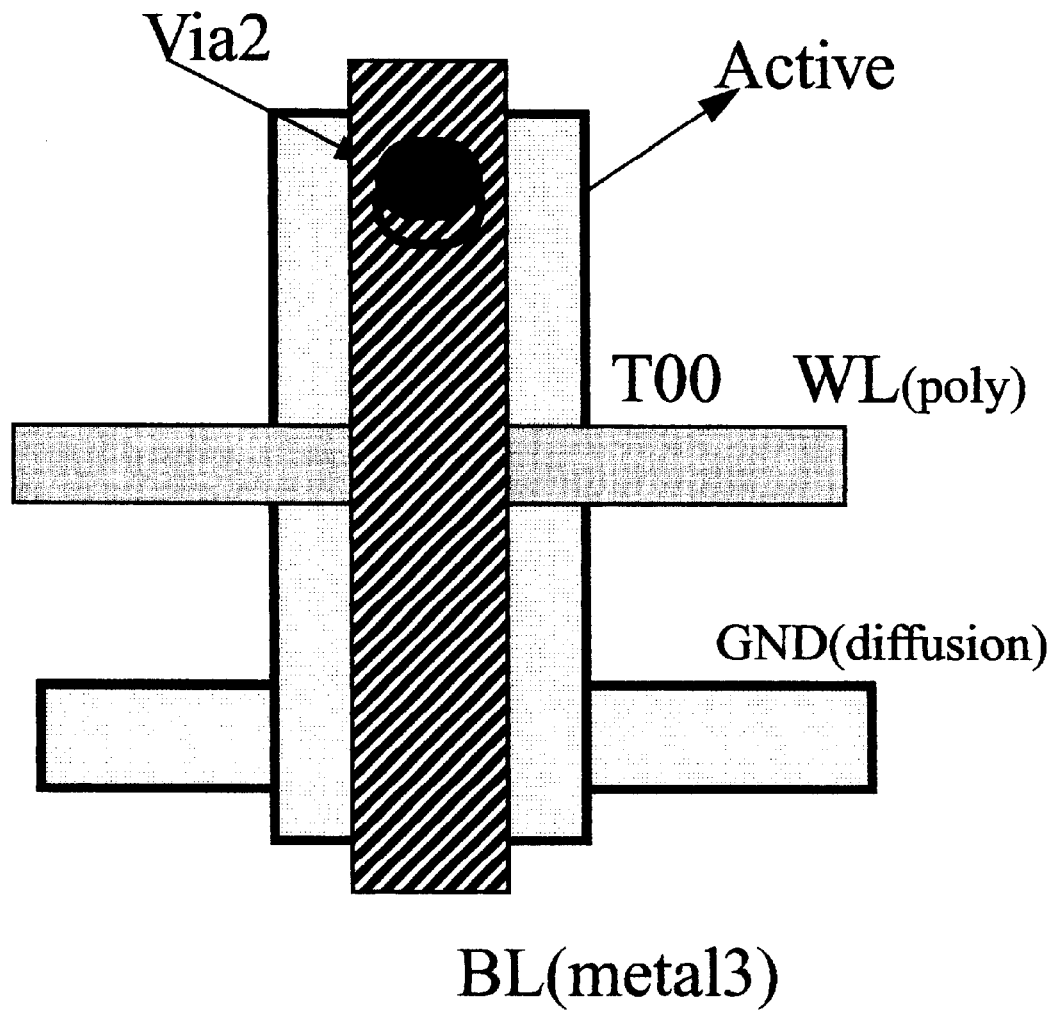
FIG. 2 is a schematic diagram illustrating the layout of a conventional BE ROM according to the prior art in 0.18 micron technology.
Figure 3:
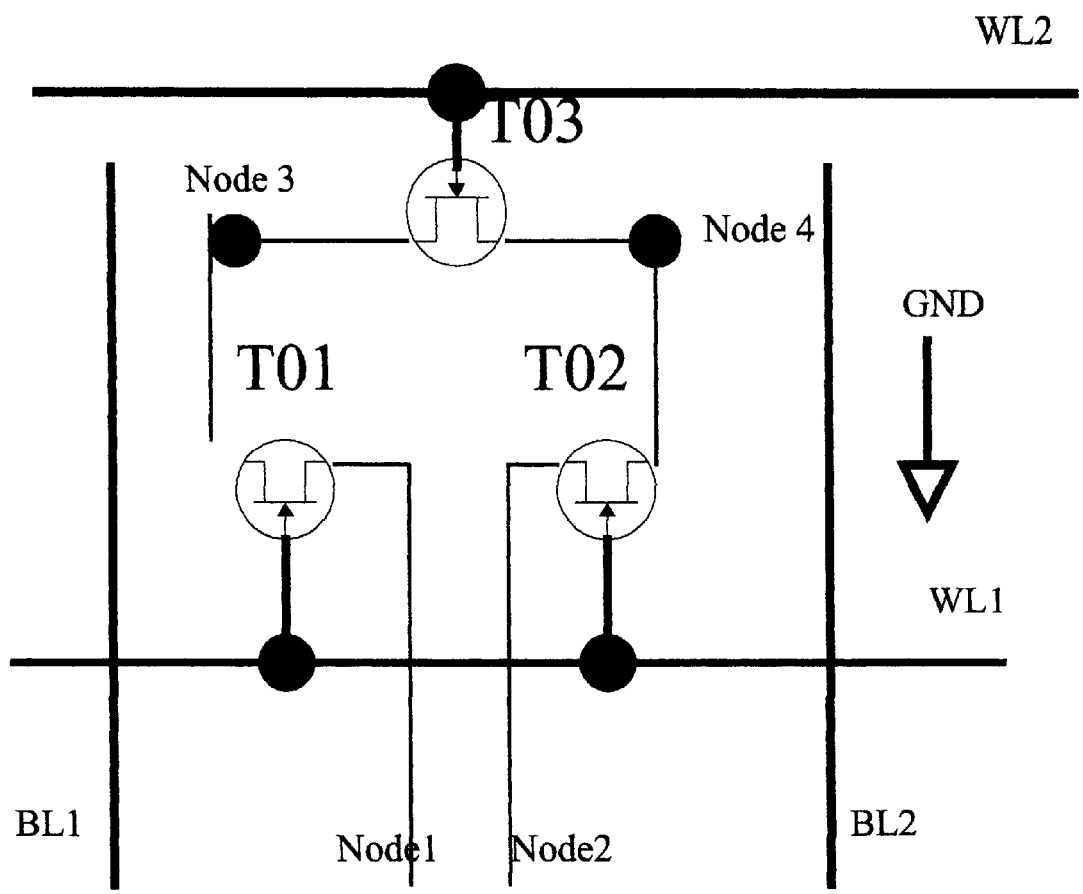
FIG. 3 is a schematic diagram of a programmable BE ROM memory cell according to the present invention.

Referring now to FIG. 3, a ROM core architecture having a memory cell including three MOS transistors T01, T02, T03 in accordance with the present invention is shown. In this memory cell, four bits of information can be stored. That is, four bits of information may be stored on the three MOS transistors T01, T02, T03 by programming the drain and source of the transistors.

Programming the ROM core architecture according to the present invention will be more clearly understood with reference to FIG. 3. Bit lines BL1, BL2 and transistors T01, T02, T03 together form one memory cell. For programming transistor T01, bit lines BL1, BL2 and GND are needed. Node 1 of the transistor T01 has bit line BL1 as its bit line. Bit line BL1 will be accessed to determine the data at node 1. Initially, all bit lines BL1, BL2, etc. are held to ground GND. When a bit line is selected (e.g., BL1), it is pre-charged to a voltage VDD. All other bit lines are held to GND.

In the row controlled by word line WL1, bit line BL1 can be connected to node 1 or node 3 only. Transistors T01 and T02 are selected by word line WL1, and transistor T03 is selected by word line WL2. In the case when word line WL1 and bit line BL1 are selected, bit line BL1 will be pre-charged to VDD and all the other bit lines (e.g., bit line BL2) will be at ground GND. Word line WL2 will be deselected so that transistor T03 can not be used to discharge bit line BL2. Bit line BL2 can be discharged by transistor T02 depending upon proper connections of node 2 and node 4. There are 16 possible ways of connecting transistors T01, T02, T03 with respect to the bit lines BL1, BL2.

Various combinations of node 1, node 2, node 3 and node 4 with respect to bit lines BL1, BL2 are given below in the order (WL1, BL1), (WL1, BL2), (WL2, BL1), (WL2, BL2):

1) Node 3 is connected to bit line BL1, node 4 is connected to bit line BL2, and node 1 and node 2 are connected to ground GND (saving 0000);
2) Node 3 is connected to bit line BL1, node 4 is connected to ground GND, node 2 is connected to bit line BL2, and node 1 is connected to ground GND (saving 0001);
3) Node 3 is connected to ground GND, node 4 is connected to bit line BL2, node 2 is connected to ground GND, and node 1 is connected to bit line BL1 (saving 0010);
4) Node 3 is connected to ground GND, node 4 is connected to ground GND, node 2 is connected to bit line BL2, and node 1 is connected to bit line BL1 (saving 0011);
5) Node 3 is connected to bit line BL1, node 4 is connected to bit line BL2, node 2 is connected to bit line BL2, and node 1 is connected to ground GND (saving 0100);
6) Node 3 is connected to bit line BL1, node 4 is connected to ground GND, node 2 is connected to ground GND, and node 1 to ground GND (saving 0101);
7) Node 3 is connected to ground GND, node 4 is connected to bit line BL2, node 2 is connected to bit line BL2, and node 1 is connected to bit line BL1 (saving 0110);
8) Node 3 is connected to ground GND, node 4 is connected to ground GND, node 2 is connected to ground GND, and node 1 is connected to bit line BL1 (saving 0111);
9) Node 3 is connected to bit line BL1, node 4 is connected to bit line BL2, node 2 is connected to ground GND, and node 1 is connected to bit line BL1 (saving 1000);
10) Node 3 is connected to bit line BL1, node 4 is connected to ground GND, node 2 is connected to bit line BL2, and node 1 is connected to bit line BL1 (saving 1001);
11) Node 3 is connected to ground GND, node 4 is connected to bit line BL2, node 2 is connected to ground GND, and node 1 is connected to ground GND (saving 1010);
12) Node 3 is connected to ground GND, node 4 is connected to ground GND, node 2 is connected to bit line BL2, and node 1 is connected to ground GND (saving 1011);
13) Node 3 is connected to bit line BL1, node 4 is connected to bit line BL2, node 2 is connected to bit line BL2, and node 1 is connected to bit line BL1 (saving 1100);
14) Node 3 is connected to bit line BL1, node 4 is connected to ground GND, node 2 is connected to ground GND, and node 1 is connected to bit line BL1 (saving 1101);
15) Node 3 is connected to ground GND, node 4 is connected to bit line BL2, node 2 is connected to bit line BL2, node 1 is connected to ground GND (saving 1110); and
16) Node 3 is connected to ground GND, node 4 is connected to ground GND, node 2 is connected to ground GND, and node 1 is connected to ground GND (saving 1111).

In condition number (1), when word line WL1 gets selected and bit line BL1 gets selected, then bit line BL1 will be pre-charged to VDD and bit line BL2 will be at ground GND. As a result, logic 0 will be read at the output, since bit line BL1 will be discharged through node 1 of T01. This condition can be understood as 0000 being stored at all the nodes, i.e., node 1, node 2, node 3, and node 4.

In condition number (2), when word line WL2 gets selected and bit line BL2 gets selected, then bit line BL2 will be pre-charged to VDD and bit line BL1 will be at ground GND only. This condition can be understood as 0001 being stored at node 1, node 2, node 3 and node 4, respectively. The other possible combinations may be similarly determined, as will be appreciated by those of skill in the art.

A logic 0 may be stored at one location in the memory cell in two different ways. Namely, the drain of the transistor may be connected to one bit line and the source of the transistor connected to another bit line, or the drain of the transistor may be connected to one bit line and the source of the transistor to ground GND. Furthermore, the storage of a logic 1 at one location may be accomplished in two different ways. These are to connect the drain and source of the transistor to the same bit line, or to connect the drain and source of the transistor to ground GND.

Figure 4:
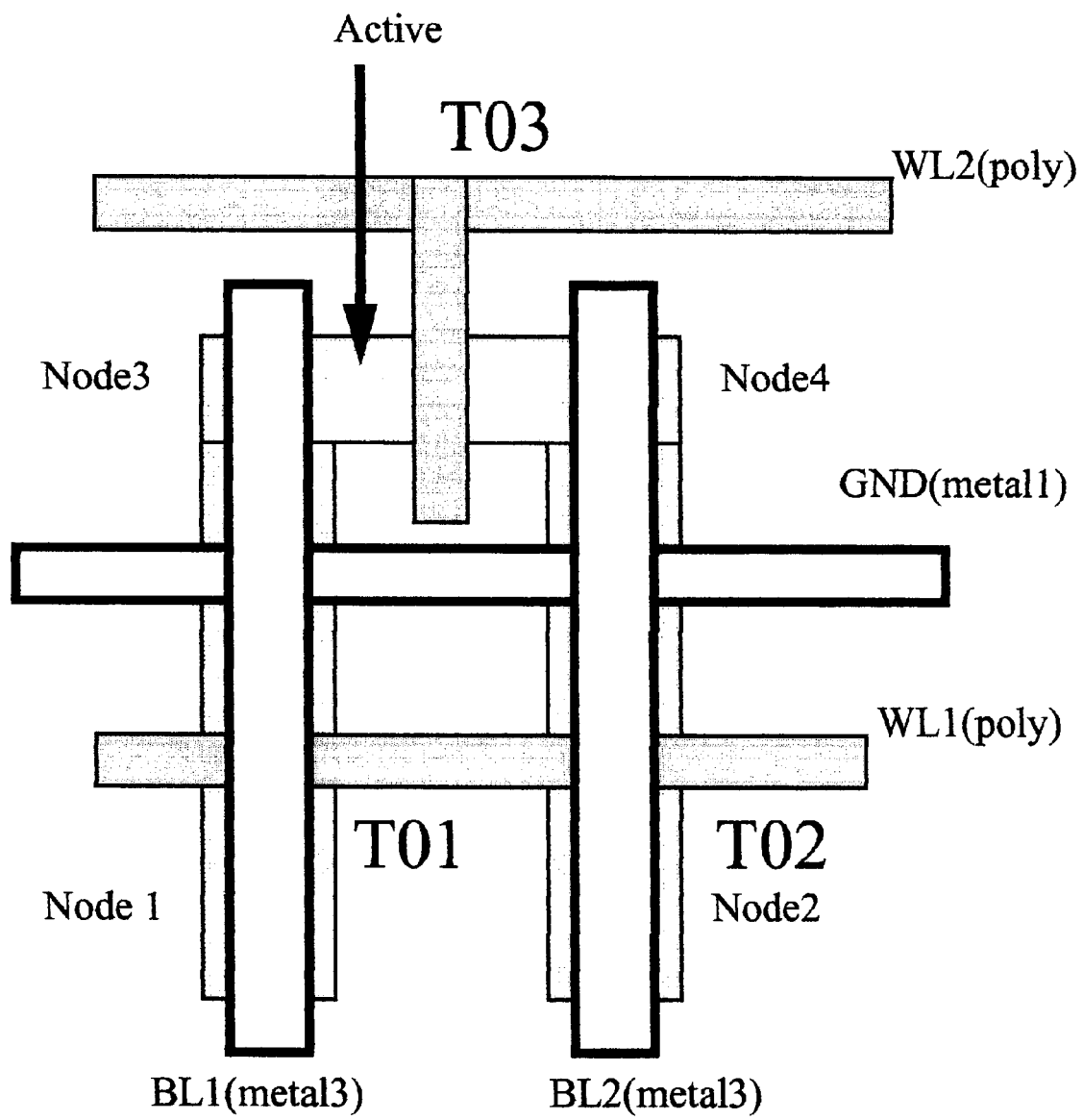
FIG. 4 is a schematic diagram of the layout of a BE ROM memory cell according to the present invention in 0.18 micron technology.
Figure 1:
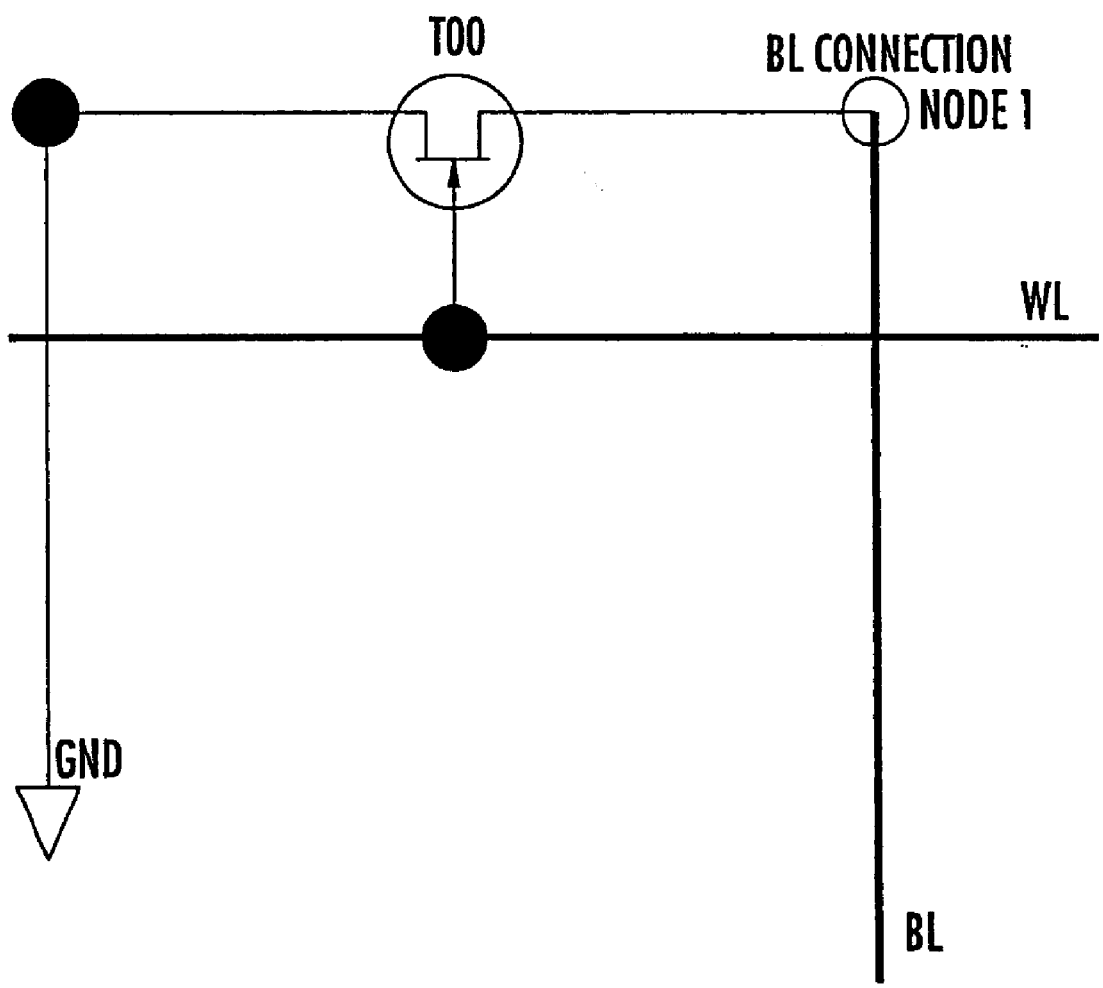
Figure 2:
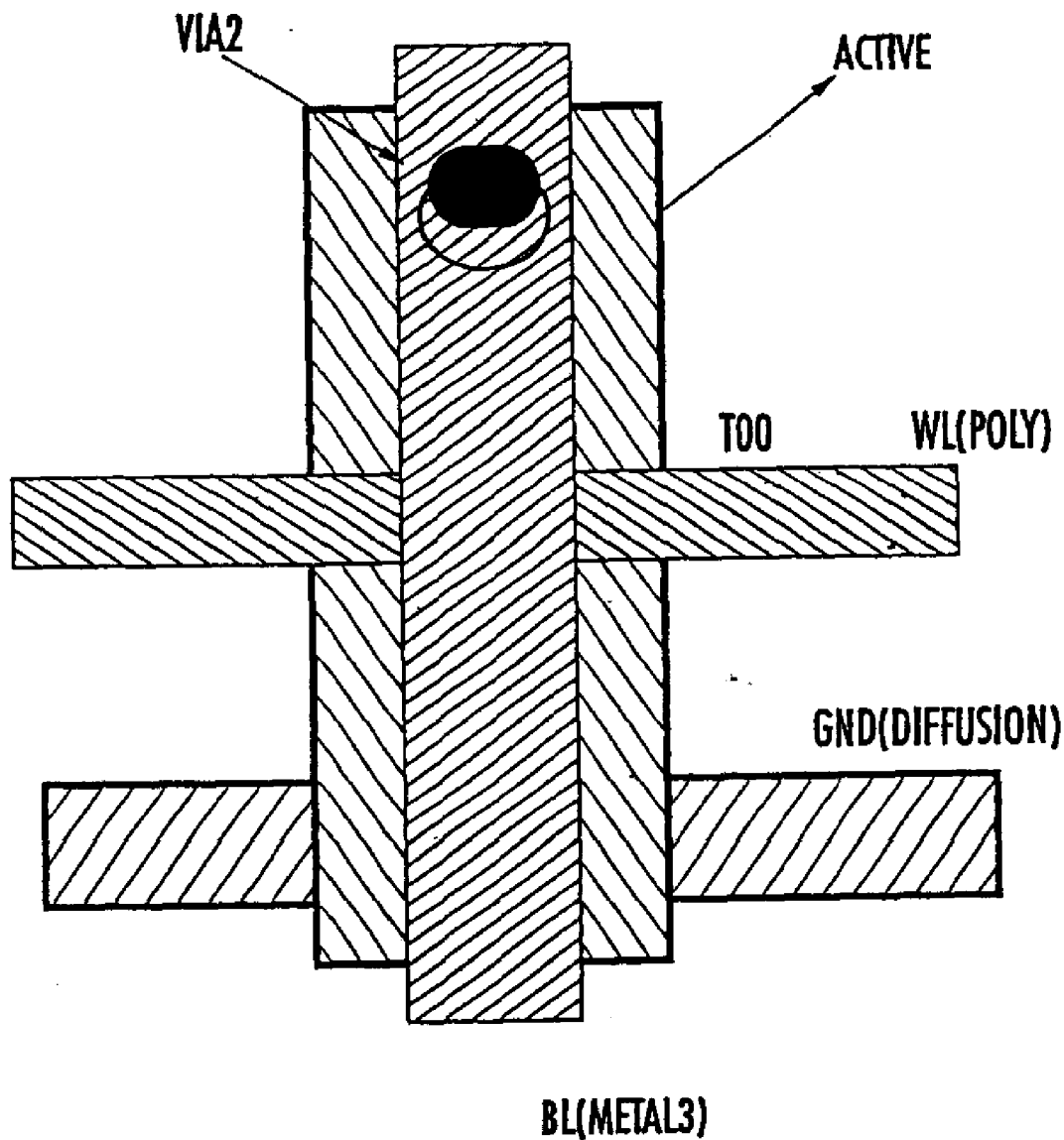
Figure 3:
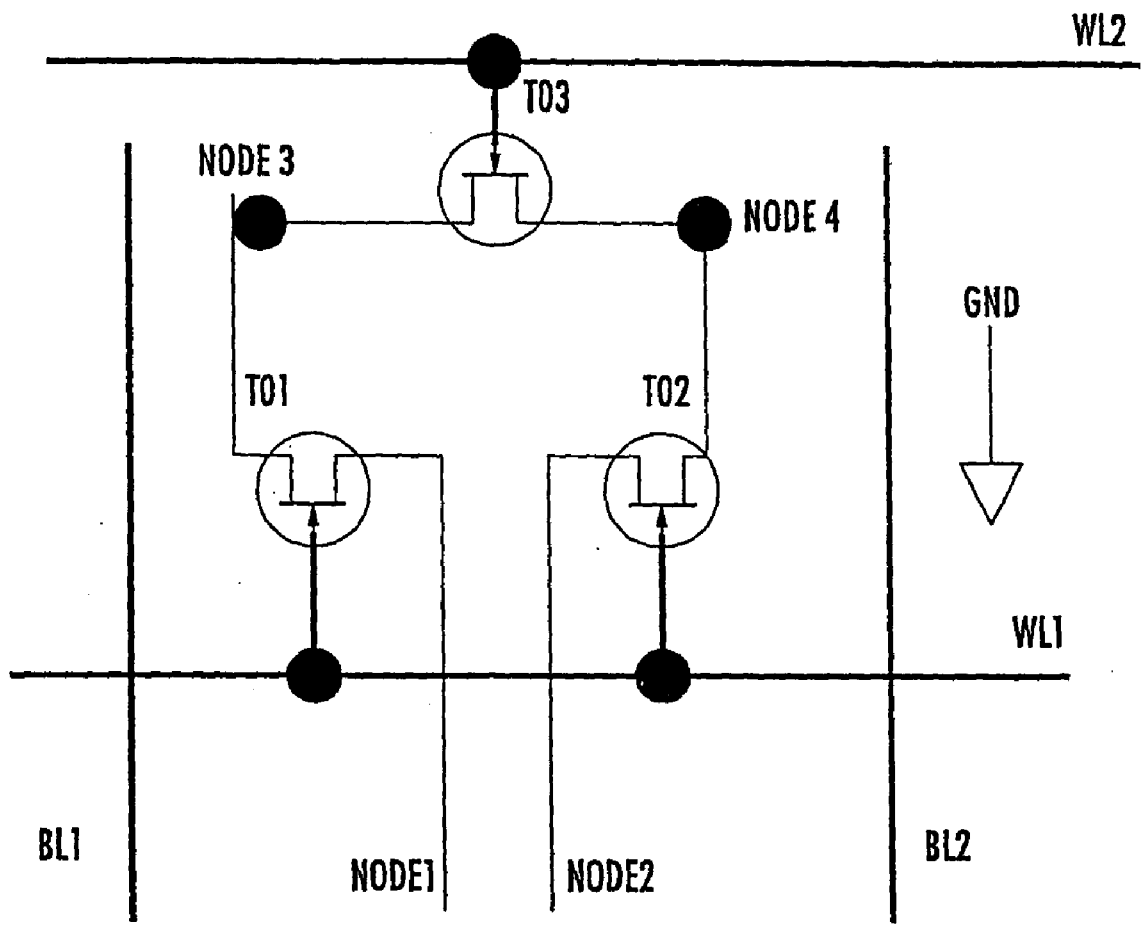
Figure 4:
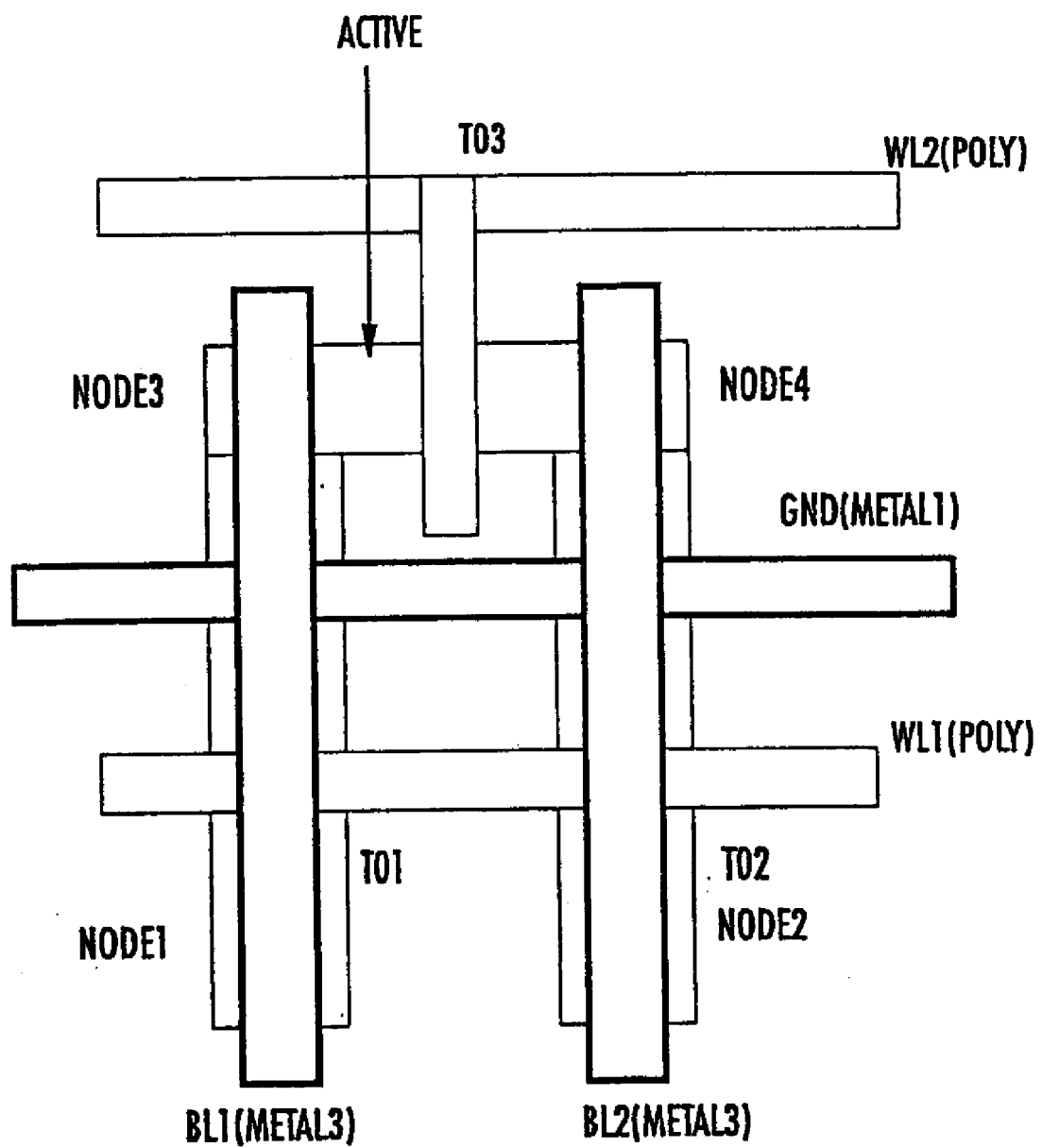

The layout of the ROM cell according to the present invention using 0.18 micron technology may be seen in FIG. 4. In every memory cell, the bit lines are in a metallization layer 2 (metal2) (not shown), and ground GND runs "horizontally" in a metallization layer 1 (metal1). The transistors are beneath the bit lines in a metallization layer 3 (metal3), and the drains and sources thereof may be connected at the metallization layer 2 (metal2).

Thus, the drain or source of a transistor can be connected to bit lines by a via via2 and to ground GND by the metallization layer 1, thus making the ROM "via2" and "metal1" programmable. A metallization layer 3 word line (not shown) gets connected to poly after every predetermined number of cells. It will be appreciated by those of skill in the art that the layout of the memory cell of the present invention is made so that the respective drain or source of transistors T01, T02, is shared with transistor T03. Moreover, node 1 may be connected to bit line BL1 or to ground GND, node 2 may be connected to bit line BL2 or to ground GND, node 3 may be connected to bit line BL1 or to ground GND, and node 4 may be connected to bit line BL2 or to ground GND.

It will also be appreciated that the ROM cell of the present invention provides numerous advantages. For example, it has fast time to market, since programming is done using BE layers during fabrication. Further, power consumption is reduced since only the selected bit line will be discharged. Reliability is improved since there are no high impedance nodes in the memory cell. Additionally, conventional ROMs have the drawback of a resistive ground GND bus, since ground GND is routed in a diffusion layer. Yet, the ROM memory cell of the present invention has the ground GND signal in the metallization level 1. Also, leakage current is reduced since all unselected bit lines are connected to ground GND. In addition, since four bits are stored in three transistors, the density of the memory cell of the present invention is high and is comparable to diffusion programmable ROMs.

That which is claimed is:

1. A BE type programmable read only memory (ROM) comprising:
   a plurality of memory cells organized in rows and columns;
   each of said memory cells comprising three transistors, two word lines, and two bit lines arranged such that said memory cell is capable of storing four bits of data.

2. The BE type programmable ROM according to claim 1 wherein said transistors comprise metal oxide semiconductor (MOS) transistors.

3. The BE type programmable ROM according to claim 1 wherein any two of said three transistors are independently capable of storing one bit of data in respective first conduction terminals thereof and another bit of data in respective second conduction terminals thereof.

4. The BE type programmable ROM according to claim 1 further comprising a ground metallization layer to be selectively connected to said transistors.

5. The BE type programmable ROM according to claim 1 wherein said three transistors of each memory cell are programmable according to sixteen different addressing combinations.

6. The BE type programmable ROM according to claim 5 wherein the sixteen addressing combinations comprise 0000, 0001, 0010, 0011, 0100, 0101, 0110, 0111, 1000, 1001, 1010, 1011, 1100, 1101, 1110, and 1111.

7. The BE type programmable ROM according to claim 1 wherein said two bit lines comprise first and second spaced apart metallization layers; and wherein respective first and second conduction terminals of each transistor are directly connected to said first metallization layer and connected to said second metallization layer by respective vias.

8. The BE type programmable ROM according to claim 1 wherein a logic 0 is stored by connecting a first conduction terminal of each transistor to one of said bit lines and a second conduction terminal of said transistor to a reference voltage.

9. The BE type programmable ROM according to claim 1 wherein a logic 0 is stored by connecting a first conduction terminal of each transistor to one of said bit lines and a second conduction terminal of said transistor to the other of said bit lines.

10. The BE type programmable ROM according to claim 1 wherein a logic 1 is stored by connecting both first and second conduction terminals of each transistor to one of the bit lines.

11. The BE type programmable ROM according to claim 1 wherein a logic 1 is stored by connecting both first and second conduction terminals of each transistor to a reference voltage.

12. The BE type programmable ROM according to claim 1 wherein said plurality of memory cells comprise complementary MOS (CMOS) memory cells.

13. The BE type programmable ROM according to claim 1 wherein said plurality of memory cells do not comprise any high impedance nodes.

14. The BE type programmable ROM according to claim 1 further comprising a row and column decoder and at least one word line, and wherein said row and column decoder selects a bit line of one of said plurality of memory cells that is selected by said at least one word line in a same cycle.

15. A BE type programmable read only memory (ROM) comprising:
    a plurality of memory cells organized in rows and columns, each of said memory cells comprising three transistors and two bit lines arranged such that said memory cell is capable of storing four bits of data, said three transistors of each memory cell being programmable according to sixteen different addressing combinations; and
    a ground metallization layer to be selectively connected to said transistors.

16. The BE type programmable ROM according to claim 15 wherein said transistors comprise metal oxide semiconductor (MOS) transistors.

17. The BE type programmable ROM according to claim 15 wherein any two of said three transistors are independently capable of storing one bit of data in respective first conduction terminals thereof and another bit of data in respective second conduction terminals thereof.

18. The BE type programmable ROM according to claim 15 wherein the sixteen addressing combinations comprise 0000, 0001, 0010, 0011, 0100, 0101, 0110, 0111, 1000, 1001, 1010, 1011, 1100, 1101, 1110, and 1111.

19. The BE type programmable ROM according to claim 15 wherein said two bit lines comprise first and second spaced apart metallization layers; and wherein respective first and second conduction terminals of each transistor are directly connected to said first metallization layer and connected to said second metallization layer by respective vias.

20. The BE type programmable ROM according to claim 15 wherein a logic 0 is stored by connecting a first conduction terminal of each transistor to one of said bit lines and a second conduction terminal of said transistor to said ground metallization layer.

21. The BE type programmable ROM according to claim 15 wherein a logic 0 is stored by connecting a first conduction terminal of each transistor to one of said bit lines and a second conduction terminal of said transistor to the other of said bit lines.

22. The BE type programmable ROM according to claim 15 wherein a logic 1 is stored by connecting both first and second conduction terminals of each transistor to one of the bit lines.

23. The BE type programmable ROM according to claim 15 wherein a logic 1 is stored by connecting both first and second conduction terminals of each transistor to said ground metallization layer.

24. The BE type programmable ROM according to claim 15 wherein said plurality of memory cells comprise complementary MOS (CMOS) memory cells.

25. The BE type programmable ROM according to claim 15 wherein said plurality of memory cells do not comprise any high impedance nodes.

26. The BE type programmable ROM according to claim 15 further comprising a row and column decoder and at least one word line, and wherein said row and column decoder selects a bit line of one of said plurality of memory cells that is selected by said at least one word line in a same cycle.

27. A method of using a BE type programmable read only memory (ROM) comprising a plurality of memory cells each comprising three transistors, two word lines, and two bit lines, the method comprising:

storing four data bits in the three transistors of at least one of the memory cells using the two bit lines thereof.

28. The method according to claim 27 further comprising reading data from the ROM by charging only selected bit lines and coupling all remaining bit lines to ground to reduce power consumption and leakage current.

29. The method according to claim 27 wherein storing further comprises storing the four data bits using sixteen different addressing combinations.

30. The method according to claim 27 wherein any two of the three transistors are independently capable of storing one bit of data in respective first conduction terminals thereof and another bit of data in respective second conduction terminals thereof.

31. The method according to claim 27 wherein the BE type programmable ROM further comprises a ground metallization layer to be selectively connected to the transistors.

32. The method according to claim 27 wherein storing further comprises storing a logic 0 by connecting a first conduction terminal of each transistor to one of the bit lines and a second conduction terminal of the transistor to a reference voltage.

33. The method according to claim 27 wherein storing further comprises storing a logic 0 by connecting a first conduction terminal of each transistor to one of the bit lines and a second conduction terminal of the transistor to the other of the bit lines.

34. The method according to claim 27 wherein storing further comprises storing a logic 1 by connecting both first and second conduction terminals of each transistor to one of the bit lines.

35. The method according to claim 27 wherein storing further comprises storing a logic 1 by connecting both first and second conduction terminals of each transistor to a reference voltage.

36. A method of using a BE type programmable read only memory (ROM) comprising a plurality of memory cells, each comprising three transistors and two bit lines, and a ground metallization layer to be selectively connected to the transistors, the method comprising:

storing four data bits in the three transistors of at least one of the memory cells using the two bit lines thereof and sixteen different addressing combinations.

37. The method according to claim 36 further comprising reading data from the RON by charging only selected bit lines and coupling all remaining bit lines to ground to reduce power consumption and leakage current.

38. The method according to claim 36 wherein any two of the three transistors are independently capable of storing one bit of data in respective first conduction terminals thereof and another bit of data in respective second conduction terminals thereof.

39. The method according to claim 36 wherein storing further comprises storing a logic 0 by connecting a first conduction terminal of each transistor to one of the bit lines and a second conduction terminal of the transistor to a reference voltage.

40. The method according to claim 36 wherein storing further comprises storing a logic 0 by connecting a first conduction terminal of each transistor to one of the bit lines and a second conduction terminal of the transistor to the other of the bit lines.

41. The method according to claim 36 wherein storing further comprises storing a logic 1 by connecting both first and second conduction terminals of each transistor to one of the bit lines.

42. The method according to claim 36 wherein storing further comprises storing a logic 1 by connecting both first and second conduction terminals of each transistor to a reference voltage.

* * * * *

UNITED STATES PATENT AND TRADEMARK OFFICE
CERTIFICATE OF CORRECTION

PATENT NO.   : 6,556,468 B2
DATED        : April 29, 2003
INVENTOR(S)  : Garg

It is certified that error appears in the above-identified patent and that said Letters Patent is hereby corrected as shown below:

The title page, showing an illustrative figure, should be deleted and substitute therefor the attached title page.

Delete Figures 1-4, and substitute therefor Figures 1-4 as shown on the attached pages.

Signed and Sealed this

Twenty-first Day of October, 2003

JAMES E. ROGAN
*Director of the United States Patent and Trademark Office*

United States Patent
Garg

(10) Patent No.: US 6,556,468 B2
(45) Date of Patent: Apr. 29, 2003

(54) HIGH BIT DENSITY, HIGH SPEED, VIA AND METAL PROGRAMMABLE READ ONLY MEMORY CORE CELL ARCHITECTURE

(75) Inventor: Anurag Garg, Uttar Pradesh (IN)

(73) Assignee: STMicroelectronics Ltd., Uttar Pradesh (IN)

( * ) Notice: Subject to any disclaimer, the term of this patent is extended or adjusted under 35 U.S.C. 154(b) by 0 days.

(21) Appl. No.: 09/917,226

(22) Filed: Jul. 27, 2001

(65) Prior Publication Data

US 2002/0091894 A1 Jul. 11, 2002

(30) Foreign Application Priority Data

Jul. 31, 2000 (IN) .................................................. 706/00

(51) Int. Cl.[7] ................................................ G11C 17/00
(52) U.S. Cl. ......................................... 365/104; 365/45
(58) Field of Search ............................ 365/185.03, 45, 365/104

(56) References Cited

U.S. PATENT DOCUMENTS

| | | | |
|---|---|---|---|
| 5,018,103 A | * 5/1991 | Pomper et al. | 365/104 |
| 5,640,350 A | * 6/1997 | Iga | 365/186 |
| 5,917,224 A | 6/1999 | Zangara | 257/390 |
| 5,939,740 A | * 8/1999 | Hashimoto et al. | 257/202 |

\* cited by examiner

Primary Examiner—Huan Hoang
(74) Attorney, Agent, or Firm—Allen, Dyer, Doppelt Milbrath & Gilchrist, P.A.; Lisa K. Jorgenson

(57) ABSTRACT

A high bit density, high speed, via and metal BE type programmable ROM core cell architecture for storing large amounts of non-volatile data and having a relatively fast turn around time is provided. The ROM core cell may include memory cells organized in rows and columns where each of the memory cells includes three transistors and two bit lines. The arrangement between the three transistors and two bit lines may be such that each of the memory cells is capable of storing four bits of data.

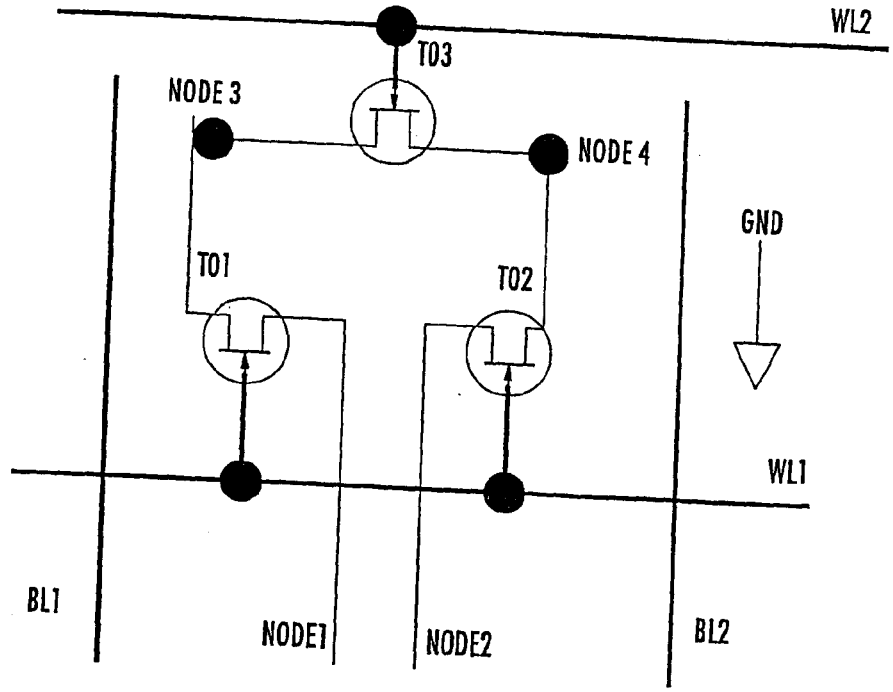

42 Claims, 4 Drawing Sheets